United States Patent
Kandiar

(10) Patent No.: US 7,251,292 B2
(45) Date of Patent: Jul. 31, 2007

(54) TECHNIQUE AND APPARATUS FOR LOW POWER WIRELESS COMMUNICATION

(75) Inventor: Ramamoorthy S. Kandiar, Tigard, OR (US)

(73) Assignee: Intel Corporation, Santa Clara, CA (US)

( * ) Notice: Subject to any disclaimer, the term of this patent is extended or adjusted under 35 U.S.C. 154(b) by 852 days.

(21) Appl. No.: 10/103,370

(22) Filed: Mar. 21, 2002

(65) Prior Publication Data

US 2003/0179815 A1      Sep. 25, 2003

(51) Int. Cl.
*H04L 25/03*   (2006.01)
(52) U.S. Cl. ................................................ 375/297
(58) Field of Classification Search ................ 375/219, 375/220, 259, 295, 297; 330/255, 262, 263, 330/275, 276
See application file for complete search history.

(56) References Cited

U.S. PATENT DOCUMENTS

| | | | | |
|---|---|---|---|---|
| 6,069,523 A | * | 5/2000 | Brown | ........................ 327/563 |
| 6,177,796 B1 | * | 1/2001 | Viti | ............................. 324/314 |
| 6,366,247 B1 | * | 4/2002 | Sawamura et al. | ......... 343/702 |
| 6,424,820 B1 | * | 7/2002 | Burdick et al. | ............. 455/41.1 |
| 6,504,433 B1 | * | 1/2003 | Weber et al. | ............... 330/277 |
| 6,519,290 B1 | * | 2/2003 | Green | ........................ 375/259 |
| 6,586,999 B2 | * | 7/2003 | Richley | ....................... 330/276 |

OTHER PUBLICATIONS

Gupta et al., Design and Optimization of CMOS RF Power Amplifiers, Feb. 2, 2001, IEEE vol. 36, No. 2, p. 166-175.*
Data Sheet RF2114 entitled, "Medium Power Linear Amplifier," pp. 2-33 through 2-38, Rev. A5 001222, www.datasheetcatalog.com.

* cited by examiner

*Primary Examiner*—Khanh Tran
*Assistant Examiner*—Sam Ahn
(74) *Attorney, Agent, or Firm*—Trop, Pruner & Hu, P.C.

(57) ABSTRACT

A system includes first unit, a processor and a transmitter. The processor is located in the first unit to generate data to be communicated to a second unit that is physically separated from the first unit. The transmitter includes an antenna, a first circuit and a push-pull amplifier. The first circuit generates signals that are indicative of the data, and the push-pull amplifier drives the antenna with a signal that is indicative of the data in response to the signals generated by the first circuit. The amplifier also establishes an output power from the amplifier to the antenna to less than about one hundred milliwatts.

26 Claims, 5 Drawing Sheets

TECHNIQUE AND APPARATUS FOR LOW POWER WIRELESS COMMUNICATION

BACKGROUND

The invention generally relates to a technique and apparatus for low power wireless communication.

In a typical computer system, a main computer unit (a desktop or laptop computer, for example) communicates with various peripheral devices, such as a printer, a keyboard, a mouse, etc. Traditionally, this communication has been made possible by various cables that connect the computer unit to the peripheral devices. However, these cables place restraints on the positions of the peripheral devices relative to the computer unit, as well as contribute to excessive clutter near the computer unit.

For purposes of eliminating the cable connections between the peripheral devices and the main computer unit, short-range wireless links may be used. As an example, communication over these wireless links may be defined by a standard, such as the Institute of Electrical and Electronics Engineers (IEEE) 802.11b standard, IEEE Std. 802.11, published in 1999, and IEEE Std. 802.11b, published as a supplement to the IEEE Std. 802.11 in 1999. As another example of another standard, communication over the wireless links may be defined by what is called the Bluetooth standard, set forth by the Bluetooth Special Interest Group (SIG) in a specification entitled, "Specification of the Bluetooth System, Volume 1: Core and Volume 2: Profiles," version 1.1, February 2001. As an example of the implementation of one of these standards, a computer system 10 may have several wireless devices that communicate over short range microwave links. For example, a main computer unit 12 may communicate over wireless links with various peripheral devices, such as a printer 14, a keyboard 16, a mouse 18, a local area network (LAN) access point 22 and a personal digital assistant (PDA) 20. The main computer unit 12 may also communicate via wireless links with one or more other computer systems, such as a computer system 29 that is depicted in FIG. 1.

A conventional wireless device that implements the IEEE 802.11b standard may include a transceiver semiconductor package, or "chip," to demodulate signals received from an antenna of the device and modulate signals to be transmitted from the antenna. For purposes of transmitting, this transceiver chip generates a pair of balanced, modulated carrier signals. In this context, "balanced signals" refers to a pair of signals in which a current that is associated with one of the balanced signals is equal in magnitude but one hundred eighty degrees (180°) out of phase with the current that is associated with the other balanced signal. Balanced signals are ideally symmetrical with respect to ground. Thus, due to this balanced arrangement, all of the current that is communicated from one balanced output terminal of the transceiver chip returns to the other balanced output terminal of the transceiver chip without returning through ground.

In addition to the transceiver chip, the transmitter circuitry of a conventional wireless device typically includes a single-ended amplifier to generate a signal to drive the antenna in response to the balanced signals that are provided by the transceiver chip. For purposes of interfacing the amplifier to the transceiver chip, the transmitter circuitry includes a balun that transforms the balanced signals provided by the transceiver chip into a single-ended signal that is received and amplified by the amplifier. Besides transforming the balanced signals into a single-ended signal, this circuitry also attempts to match the output impedance of the transceiver to the input impedance of the amplifier. Additional impedance matching circuitry may be used between the amplifier and the antenna for purposes of attempting to match the output impedance of the amplifier to the impedance of the antenna. Unfortunately, the input and output impedances of the amplifier are typically complex and small, a condition that presents challenges in designing the impedance matching circuitry and may cause excessive power dissipation by the transmitter circuitry.

Thus, there is a continuing need for an arrangement that addresses one or more of the problems states above.

DETAILED DESCRIPTION

Figure 1:
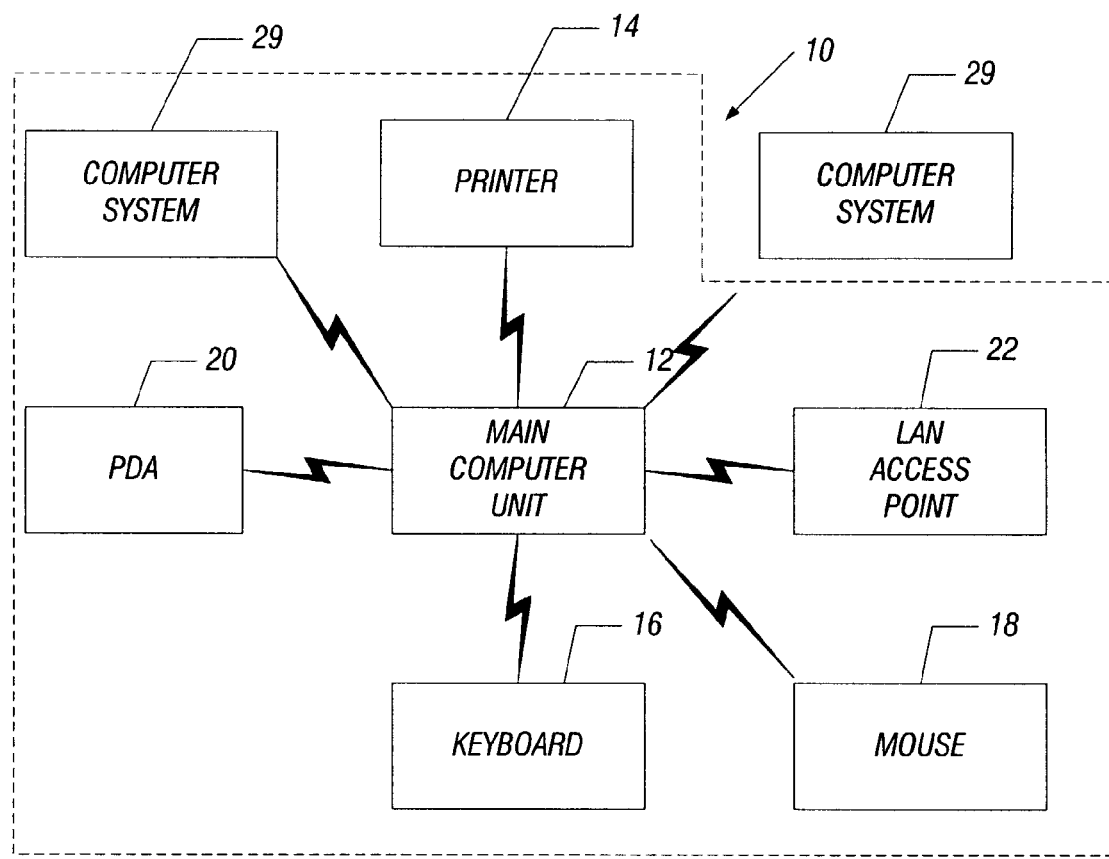
FIG. 1 is a schematic diagram of a wireless communication system of the prior art.
Figure 2:
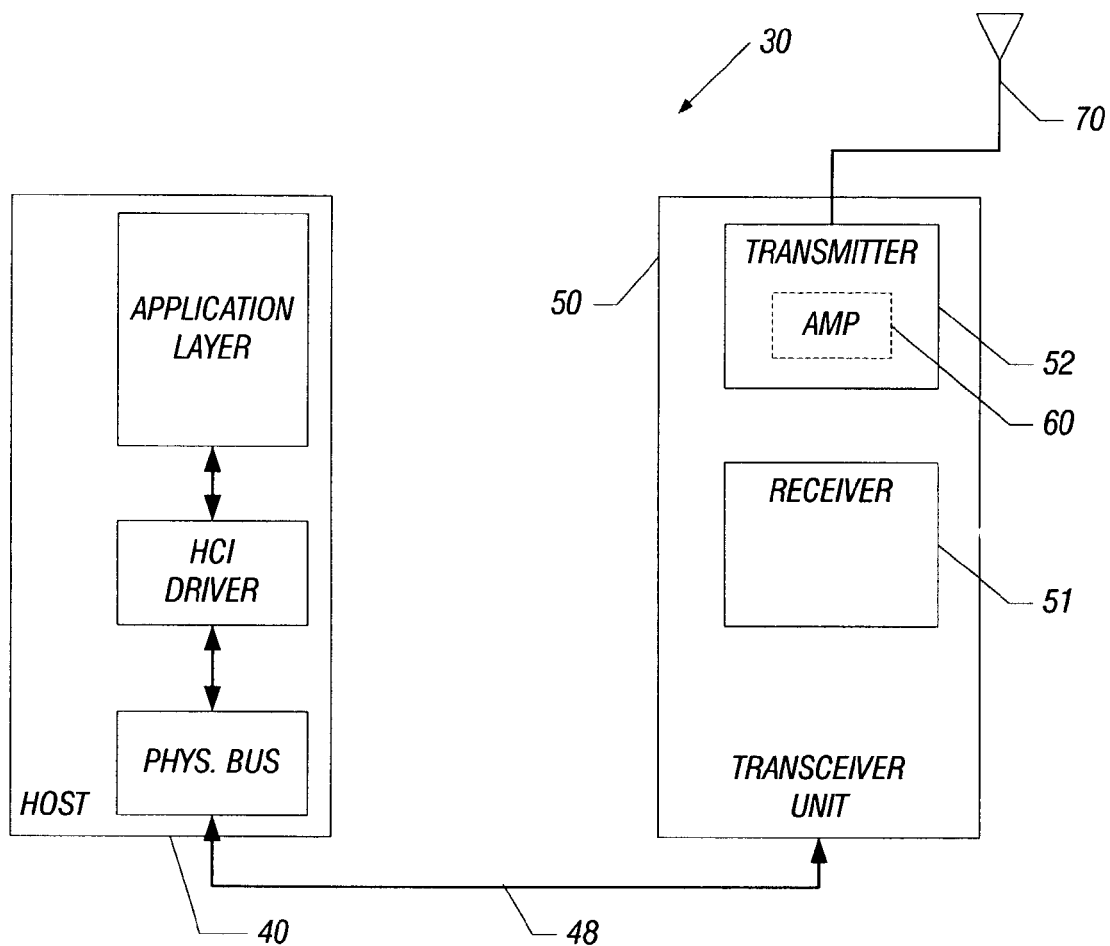
FIG. 2 is a schematic diagram of a wireless communication device according to an embodiment of the invention.

Referring to FIG. 2, an embodiment 30 of a wireless communication device in accordance with the invention includes a host 40 and a transceiver unit 50. The transceiver unit 50 includes a transmitter 52 that is enabled to transmit a short range, low power microwave communication signal to nearby wireless devices, and the transceiver unit 50 also includes a receiver 51 that is enabled to receive such signals from one or more adjacent wireless devices. Thus, the transceiver unit 50 establishes short-range, low power microwave communication between the host 40 and another wireless device.

As an example, the wireless communication device 30 may be a main computer unit or a peripheral device of a computer system. In this manner, in some embodiments of the invention, the wireless communication device 30 may be a desktop or laptop computer. In these embodiments of the invention, the transceiver unit 50 may be an expansion card (for example) that is inserted into a slot connector of the computer and communicates with the rest of the computer (i.e., the host 40) via a bus 48. In other embodiments of the invention, the wireless communication device may be a personal digital assistant (PDA), a mouse, a keyboard, a printer, a local area network (LAN) access point, another computer system, etc.

More specifically, in some embodiments of the invention, the transceiver unit 50 may comply with a short range wireless standard, such as the IEEE 802.11b standard or Bluetooth standard. In some embodiments of the invention, for purposes of transmitting, the transmitter 52 drives an antenna 70 of the wireless device 30 with a modulated carrier signal that has a microwave frequency. The signal level at which the transmitter 52 drives the antenna is sufficiently small to limit the output power from an amplifier of the transmitter 52 to the antenna 70 to between approximately 30 to 100 milliwatts (mW). Such an output power establishes a transmission range less than about 100 meters.

For purposes of improving the efficiency of transmissions from the transceiver unit 50, in some embodiments of the invention, the transceiver unit 50 includes a push-pull amplifier 60, a component of the transmitter 52 of the transceiver unit 50. In contrast to the single-ended amplifiers used in conventional transmitters for low power and short range microwave transmissions, the use of the push-pull amplifier 60 reduces the overall power consumption of the transmitter 52. This power reduction is attributable to the reduction in the power consumed in a push-pull amplifier versus a single-ended amplifier, as well as the reduction in power loss in the less complicated output matching circuitry to connect the amplifier 60 to the antenna 70, as discussed below.

There are two figures of merits to characterize the amplifier's efficiency.

One of these figures of merit, the power added efficiency (called "K$_{PA}$"), is defined as follows:

$$K_{PA} = \frac{Po\ Pi}{VSupply * ISupply} * 100\%, \quad \text{Equation 1}$$

where "Pi" represents the power input to the amplifier 60, "Po" represents the power output from the amplifier, "Psupply" represents the supply voltage to the amplifier 60 and "ISupply" represents the supply current to the amplifier 60.

The other figure of merit, the total efficiency (called "η tot"), is defined as follows:

$$\eta_{tot} = \frac{Po}{VSupply * ISupply} * 100\%. \quad \text{Equation 2}$$

As described below, unlike the single-ended amplifier used in conventional, short range microwave transmitters, the push-pull amplifier 60 provides relatively high efficiency and high output power, while presenting low input and output impedances. In this manner, the conventional amplifier used in conventional short range microwave transmitters of the prior art often present complex input and output impedances, rendering matching task tough. Furthermore, because the high power transistors in a conventional amplifier has very low input and output impedances, designers are challenged to match combined devices to load. In contrast, the push-pull amplifier 60 presents higher input and output impedances that are easier to match. Therefore the amplifier 60 minimize losses through better impedance matching.

Figure 3:
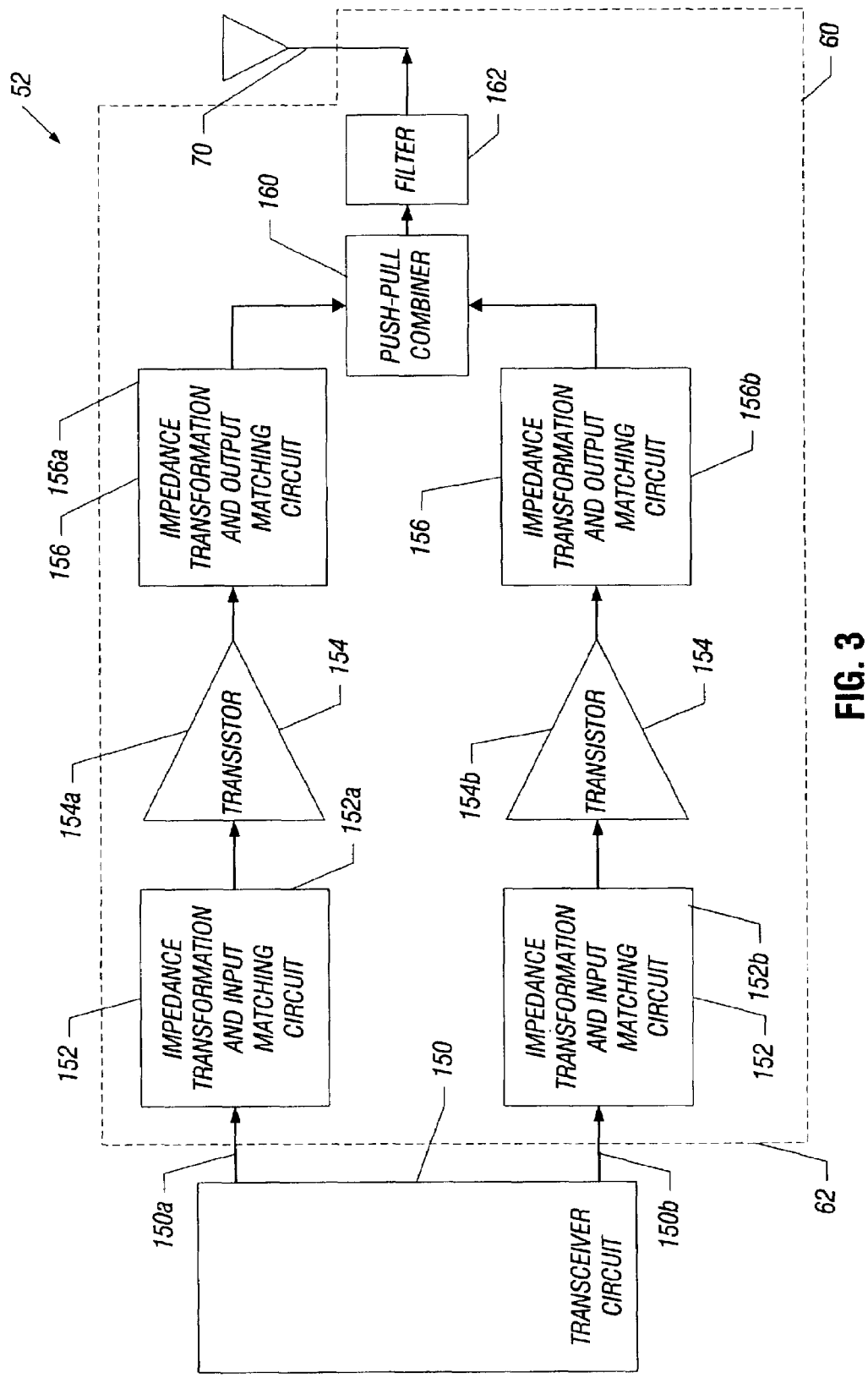
FIG. 3 is a schematic diagram of transmission circuitry of the wireless communication device of FIG. 2 according to an embodiment of the invention.

More particularly, referring to FIG. 3, an embodiment 52 of the transmitter of the transceiver unit 50 includes a transceiver circuit 150. The transceiver circuit 150 includes two output terminals 150a and 150b that, in response to the transmitter 150 being enabled, furnish two respective balanced and modulated carrier signals having frequencies (frequencies between 2.4 to 2.5 GHz, for example) in the microwave range. In this context of this application, "balanced signals" means that the signals are substantially symmetrical with respect to ground. Thus, due to this balanced arrangement, substantially all of the current that is communicated from one of the output terminals 150a and 150b returns to the other output terminal 150a, 150b without returning through a ground path.

The output terminal 150a is coupled to an impedance transformation and input matching circuit 152a that substantially matches the output impedance at the output terminal 150a to the input impedance of a transistor 154a, one of the two amplifying components of the amplifier 60. The circuit 152a also transforms the balanced signal that is provided by the output terminal 150a into a single-ended signal that is amplified by the transistor 154a. The output terminal 150b of the transmitter 150 is coupled to an impedance transformation and input matching circuit 152b that substantially matches the output impedance at the output terminal 150b to the input impedance of a transistor 154b, the other amplifying component of the amplifier 60. The circuit 152b also transforms the balanced signal that is provided by the output terminal 150b into a single-ended signal that is amplified by the transistor 154b.

As an example, in some embodiments of the invention, the signal that is provided by the output terminal 150a may be an in-phase signal (relative to the signal present at the output terminal 150b), and the transistor 154a provides an amplified version of this signal at its output terminal. In these embodiments, the signal that is provided by the output terminal 150b is one hundred eighty degrees out of phase with the signal that appears at the output terminal 150a, and the transistor 154b provides an amplified version of the signal on the output terminal 150b at the output terminal of the transistor 154b.

The output terminal of the transistor 154a is coupled to an impedance transformation and output matching circuit 156a that matches the output impedance of the transistor 154a to the input resistance of a push-pull combiner 160. The output terminal of the transistor 154b is coupled to an impedance transformation and output matching circuit 156b that matches the output impedance of the transistor 154b to the input resistance of the push-pull combiner 160. The circuits 156a and 156b provide two balanced output signals to the push-pull combiner 160 that, in turn, drives an antenna 70. In some embodiments of the invention, a filter 162 is interposed between the output terminals of the push-pull combiner 160 and the antenna 70.

Figure 4:
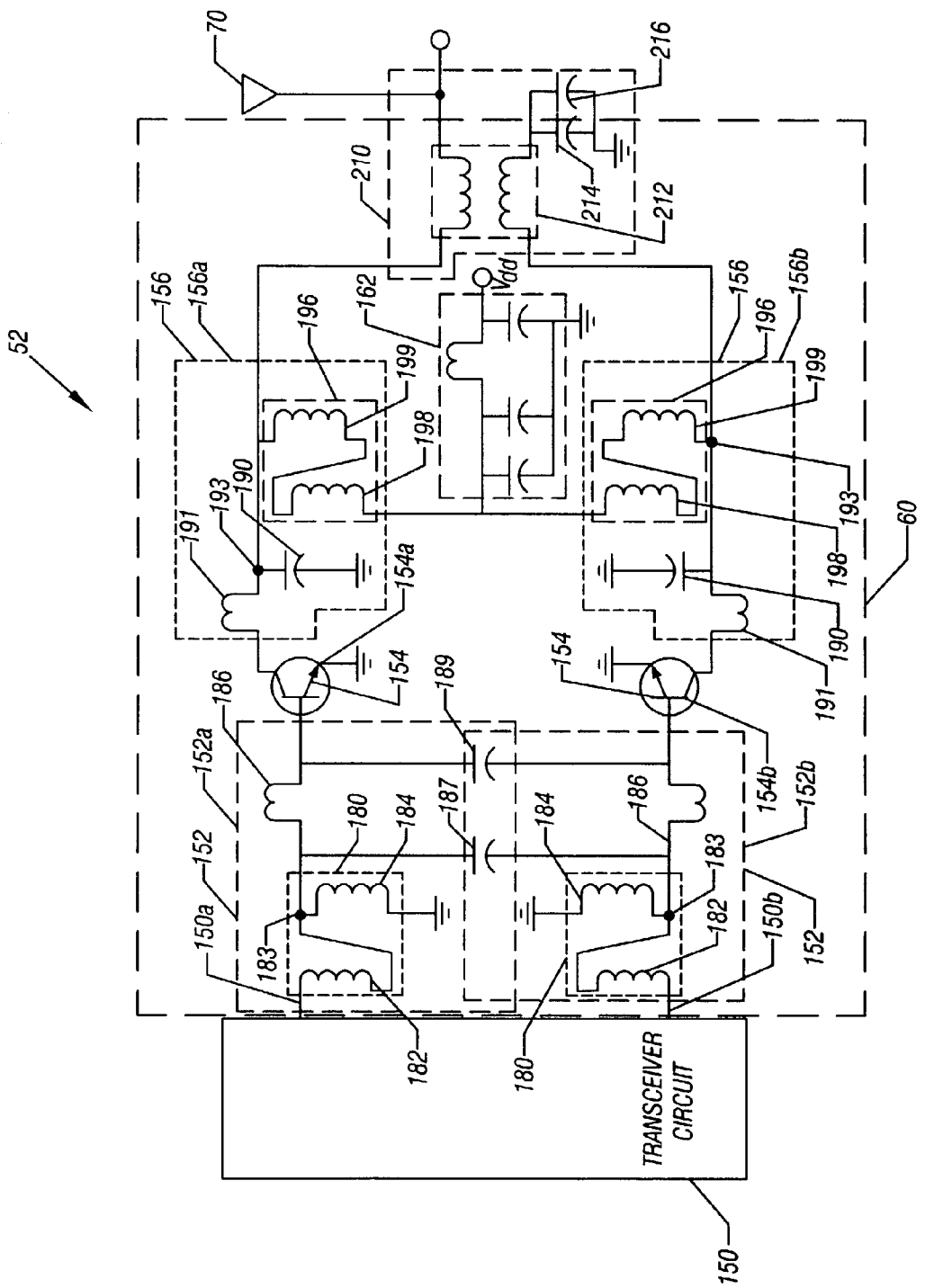
FIG. 4 is a more detailed schematic diagram of the transmission circuitry of FIG. 4 according to an embodiment of the invention.

FIG. 4 depicts a more detailed schematic of an embodiment of the transmission circuitry 52. Among the features of the circuitry 52, the transformation and impedance matching circuits 152a, 152b, 156a and 156b include balun transformers, in some embodiments of the invention. A balun transformer transforms a balanced system that is symmetrical (with respect to ground) into an unbalanced system with one side grounded. As an example, balun transformers can also reduce a 4:1 impedance ratio, for example, to 6.25 ohms or less. A design will offer many balun transformers advantages: the balun transformers and associated matching circuits have greater bandwidth, lower losses and reduced even harmonic levels.

In the simplest balun transformer that uses a coaxial transmission line, the grounded outer conductor make an unbalanced termination, and the floating end makes a balanced termination. Alternatively, a particular balun transformer may be an air core device that is formed from, for example, a microstrip, an arrangement that avoids the inherent connection problem of semi-rigid coaxial cable for microwave circuits. A potential problem in the implementation of microstrip or stripline on FR4 printed circuit board (PCB) material is the signal loss associated with the capacitance of the FR4 material. The availability of easy bending and forming-type coaxial cable eliminate the connection problems that are associated with balun transformer designs that are implemented with semi-rigid coaxial cable. The balun transformers that are implemented with easy bending and forming-type coaxial cable reduces the power loss caused by the PCB material FR4 in the input and output matching circuitry.

If broadband performance is desired, push-pull configuration makes the impedance matching easier to implement to a 50-ohm interface due to initially higher device impedance levels. The impedance transformation required in push-pull configuration is simpler and easier because of the higher impedance offered by the devices. Another advantage with the push-pull design is that the power levels of two amplification devices are automatically combined for higher power output levels, which allows the use of electrically smaller individual devices. An obvious advantage with push-pull transistors is the close proximity of the two transistors.

The base-to-base impedance in a class C-biased push-pull transistor pair is approximately four times that of the base-to-ground impedance of one transistor. However when the push-pull transistors are biased to class A, the base-to-base impedance of the push-pull transistor pair approaches two times the base-to-ground impedance primarily because of the heavily forward biased base-emitter junctions. Since in a push-pull arrangement, the output voltage swing is twice that of the voltage swing of a single-ended device, the impedance will be four times higher. Up to frequencies at which the output impedance on the Smith chart plot becomes inductive, Equations 1 and 2 recited above give accurate results for all practical purposes, but the output capacitance may have to be taken into account especially in narrow band circuits.

When designing an amplifier for a frequency of operation between approximately 2.4 to 2.5 GHz, the total efficiency is the first goal. For the case where the transistors 154a and 154b are bipolar junction transistors (BJT)s, the overall efficiency is the combination of good collector efficiency and high gain. For purposes of achieving sufficient collector efficiency, in some embodiments of the invention, the transistors 154a and 154b are biased to operate as class C amplifiers. Also to achieve sufficient collector efficiency, the circuits 156a and 156b ensure that the load impedances seen by the amplifiers significantly matches the transistors' output impedances at the operation power level.

Class C amplifiers are non-linear devices. Thus, it is possible that the harmonic content of the output signal of this type of amplifier can be very high, thereby possibly wasting efficiency and reducing the efficiency of the amplifier. However, due to the use of balanced amplification by the transistors 154a and 154b, all the even harmonics are largely suppressed to minimize the dissipation of power. The push-pull arrangement has the additional advantage that the input and output impedances of the two transistors 154a and 154b are effectively coupled together. These larger impedances significantly simplify the design of the circuits 152a, 152b, 156a and 156b for purposes of impedance matching. Because the impedance transformation by each of these circuits is lower, the power losses are smaller and the gain and efficiency are higher than non push-pull-type amplifiers.

Another important consideration in the design of an amplifier that operates near 2.4 to 2.5 GHz amplification is the ruggedness of the amplifier. The amplifier should be designed to withstand at least a voltage standing wave ratio (VSWR) of about 3:1. The amplifier 60 satisfies this criteria as the collector voltage swing (assuming the transistors are BJTs) can be close to three times the collector supply voltage, in some embodiments of the invention.

Since two transistors are sharing the overhead between themselves, the thermal management is made somewhat easier, as compared to a single-ended design. In contrast to the push-pull design, single ended amplifiers require multiple amplification stages to achieve a 100 milliwatt output power. Furthermore, the push-pull design improves the isolation against reverse intermodulation distortion, as compared to a single-ended amplifier design.

Turning now to a more specific design for a particular embodiment of the invention depicted in FIG. 4, the circuit 152a, 152b may include a balun transfomer 180, a balun transformer that may be represented by two inductors 182 and 184. The inductor 182 has one terminal that is coupled to the output terminal 150a of the transceiver unit 55 and another terminal of the inductor 182 forms a node 183 that is coupled to a terminal of the inductor 184. The other terminal of the inductor 184 is coupled to ground. An inductor 186 of the circuit 152a, 152b is coupled between the node 183 and the base terminal of the bipolar junction transistor (BJT) 154a, 154b.

For the transistor 154a, the BJT is an NPN transistor. For the transistor 154b, the BJT is an NPN transistor. The emitter terminal of the transistor 154a, 154b is coupled to ground, and the collector terminal of the transistor 154a, 154b is coupled to the output transformation and impedance matching circuit 156a, 156b.

In some embodiments of the invention, the output transformation and impedance matching circuit 156a, 156b includes an inductor 191 that has one terminal that is coupled to the collector terminal of the transistor 154. The other terminal of the inductor 191 forms a node 193. A terminal of a capacitor 190 is coupled between the node 193 and ground. A balun 196 of the circuit 156 is coupled between the node 193 and the push-pull combiner 210. The balun 196 includes two inductors 198 and 199 that are coupled in series between the nodes 193 of both baluns 196.

The filter 162 may be coupled between the adjoining terminals of the two inductors 198 and ground. The filter 162 is also coupled to a positive supply voltage (called "$V_{dd}$") for purposes of biasing the output side of the transistors 154a and 154b. The base terminals of the transistors 154a are biased by circuitry (not shown) to place the transistors 154a and 154b in the class AB mode of operation.

The combiner 210 may include, for example, a balun transformer 212 that transforms the balanced signals that are provided by the transistors 154a and 154b into single-ended signal to drive the antenna 20. This balun 212 is coupled to an output terminal 220 of the transceiver unit 60.

Figure 5:
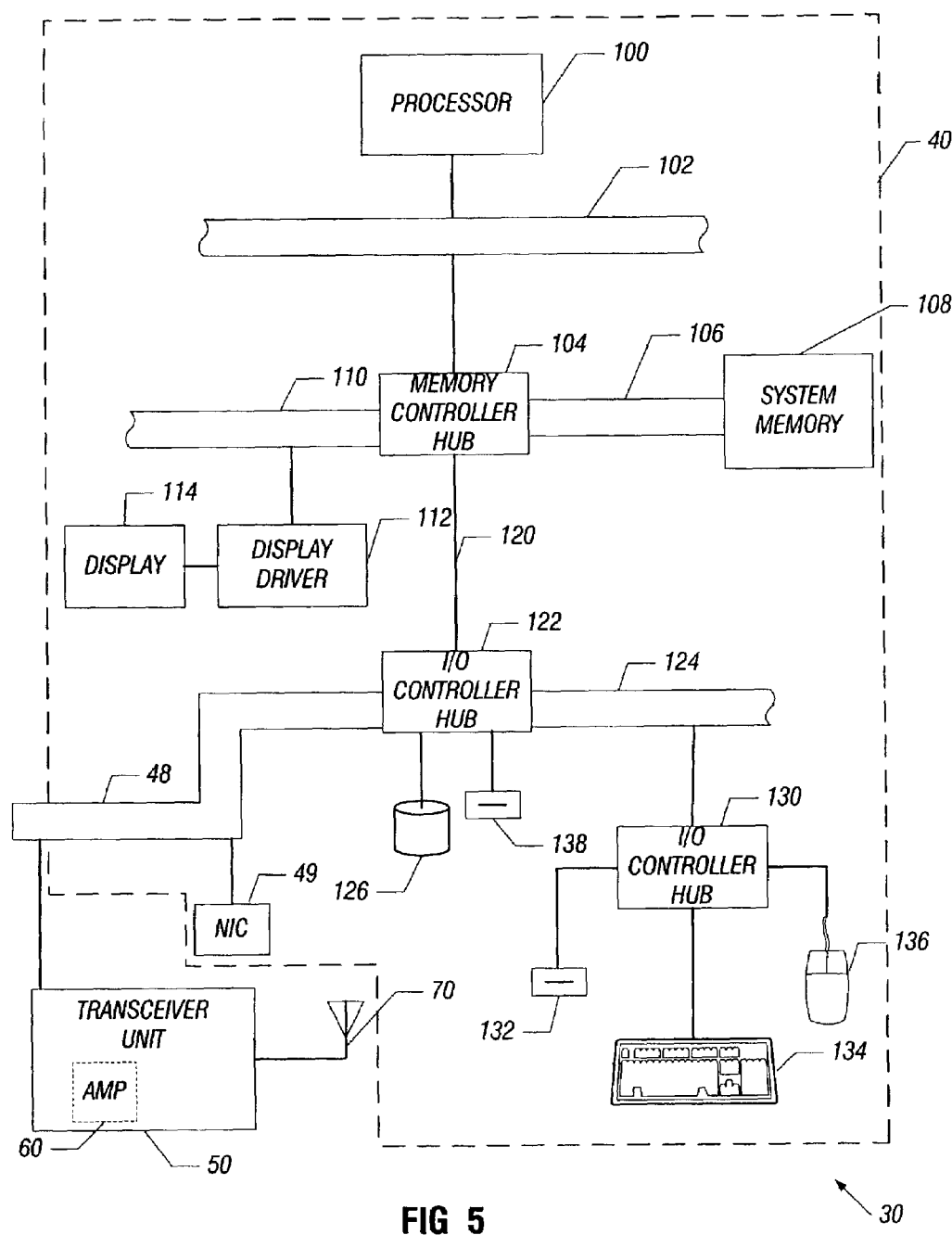
FIG. 5 is a schematic diagram of a computer system in accordance with an embodiment of the invention.

Referring to FIG. 5, in some embodiments of the invention, the wireless communication device 30 may be a computer system. In this manner, the transceiver unit 50 may be a Peripheral Component Interconnect (PCI) card that is inserted into a PCI bus slot connector that couples the transceiver unit 50 to the rest of the computer system serving with the host 40. The PCI Specification is available from The PCI Special Interest Group, Portland, Oreg. 97214. In some embodiments of the invention, it includes a processor 100 (a microprocessor, for example) that is coupled to a host bus 102. A north bridge, or memory controller hub 104, may be coupled to the host bus 102 and establish interfaces to a memory bus 106, an Accelerated Graphics Port (AGP) bus 110 and a hub link 120. The AGP standard is described in detail in the Accelerated Graphics Port Interface Specification, revision 1.0, published on Jul. 31, 1996, by Intel Corporation of Santa Clara, Calif. A display driver 112 may be an AGP device that is coupled to the AGP bus 110 to drive signals for a display 114. The memory bus 106 is coupled to a system memory 108.

The hub link 120 establishes communications between the memory controller hub 104 and a south bridge, or input/output (I/O) controller hub 122. In some embodiments of the invention, the I/O controller hub 122 may provide an interface to the PCI bus 48 (that establishes communication between the transceiver unit 50 and host 40), as well as to an I/O expansion bus 124.

An I/O controller hub 130 may be coupled to the I/O expansion bus 124 and receive data from a mouse 136 and a keyboard 134, as well as control operations of a floppy disk drive 132. The I/O controller hub 122 may, for example, control operations of a hard disk drive 126 and a CD-ROM drive 138. The PCI bus 48 may, for example, be coupled to a network interface card (NIC) 49 as well as be coupled to the transceiver unit 50 through slot connectors, for example.

While the present invention has been described with respect to a limited number of embodiments, those skilled in the art, having the benefit of this disclosure, will appreciate numerous modifications and variations therefrom. It is intended that the appended claims cover all such modifications and variations as fall within the true spirit and scope of this present invention.

What is claimed is:

1. A system comprising:
   a first unit;
   a processor located in the first unit to generate data to be communicated to a second unit physically separated from the first unit; and
   a transmitter comprising:
      an antenna;
      a first circuit to generate signals indicative of the data; and
      a push-pull amplifier to drive the antenna with a signal indicative of the data in response to the signals generated by the first circuit and to establish an output power from the push-pull amplifier to the antenna less than about one hundred milliwatts, wherein the push-pull amplifier is biased to operate as a Class C amplifier and the push-pull amplifier comprises:
         a transistor to amplify one of the signals generated by the first circuit; and
         a balun transformer to substantially match an output impedance of the first circuit with an input impedance of the transistor.

2. The system of claim 1, wherein the balun transformer comprises an inductor having an air core.

3. The system of claim 1, wherein the balun transformer comprises at least one coaxial cable.

4. The system of claim 1, wherein the balun transformer passes microwave frequencies.

5. The system of claim 1, wherein the signal that drives the antenna has a carrier signal that has a microwave frequency.

6. The system of claim 1, wherein the push-pull amplifier establishes the output power from the amplifier to the antenna to between approximately thirty to one hundred milliwatts.

7. The system of claim 1, wherein the push-pull amplifier comprises:
   a push-pull combiner circuit to combine additional signals produced in response to the signals generated by the first circuit to produce said signal indicative of the data.

8. The system of claim 1, wherein the first unit comprises a computer.

9. The system of claim 1, wherein the first unit comprises a laptop computer.

10. The system of claim 1, wherein the second unit comprises a peripheral device to a computer.

11. The system of claim 1, wherein the first unit comprises a peripheral device to a computer.

12. A method comprising:
   generating signals in a data processing system indicative of data to be communicated over a wireless link;
   combining the signals in a push-pull amplifier to generate a signal indicative of the data, the push-pull amplifier being biased to operate as a Class C amplifier;
   driving an antenna with the signal generated by the combining;
   limiting a power output from the push-pull amplifier to the antenna to less than about one hundred milliwatts; and
   substantially matching an output impedance of a transistor used to amplify one of the signals generated by the data processing system with an input impedance of the push-pull amplifier.

13. The method of claim 12, further comprising:
   using a balun transformer to substantially match the output impedance with the input impedance.

14. The method of claim 13, wherein the balun transformer comprises an inductor having an air core.

15. The method of claim 13, wherein the balun transformer comprises at least one coaxial cable.

16. The method of claim 13, wherein the balun transformer passes a carrier signal that has a microwave frequency.

17. The method of claim 12, further comprising:
   communicating a microwave carrier frequency to the antenna.

18. The method of claim 12, further comprising:
   limiting the output power to about thirty to one hundred milliwatts.

19. The method of claim 12, further comprising:
   combining additional signals produced in response to the signals generated by the data processing system to produce said signal indicative of the data.

20. An apparatus comprising:
   an antenna;
   a first circuit to generate signals indicative of data to be communicated over a wireless link to a second unit physically separated from the first unit; and
   a push-pull amplifier to drive the antenna with a signal indicative of the data in response to the signals generated by the first circuit and to establish an output power from the push-pull amplifier to the antenna less than about one hundred milliwatts, wherein the push-pull amplifier is biased to operate as a Class C amplifier and the push-pull amplifier comprises:
      a transistor to amplify one of the signals generated by the first circuit; and
      a balun transformer to substantially match an output impedance of the first circuit with an input impedance of the transistor.

21. The apparatus of claim 20, wherein the balun transformer comprises an inductor having an air core.

22. The apparatus of claim 20, wherein the balun transformer comprises at least one coaxial cable.

23. The apparatus of claim 20, wherein the balun transformer passes a carrier signal that has a microwave frequency.

24. The apparatus of claim 20, wherein the push-pull amplifier communicates a carrier signal that has a microwave frequency to the antenna.

25. The apparatus of claim 20, wherein the push-pull amplifier limits the output power to between about thirty to one hundred milliwatts.

26. The apparatus of claim 20, wherein the push-pull amplifier comprises: a push-pull combiner circuit to combine additional signals produced in response to the signals generated by the first circuit to produce said signal indicative of the data.

* * * * *